(12) United States Patent
Kim (10) Patent No.: US 7,883,978 B2
(45) Date of Patent: Feb. 8, 2011

(54) SEMICONDUCTOR DEVICE AND METHOD FOR MANUFACTURING THE SAME

(75) Inventor: Sung Jin Kim, Busan (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/247,068

(22) Filed: Oct. 7, 2008

(65) Prior Publication Data

US 2009/0152616 A1 Jun. 18, 2009

(30) Foreign Application Priority Data

Dec. 14, 2007 (KR) ................. 10-2007-0130937

(51) Int. Cl.
*H01L 21/336* (2006.01)
(52) U.S. Cl. .............. 438/299; 438/301; 438/303; 438/306
(58) Field of Classification Search ......... 438/229–232, 438/301–306, 595, 257–265; 257/314, 315, 257/E21.422, E21.433
See application file for complete search history.

(56) References Cited

U.S. PATENT DOCUMENTS

| | | | | |
|---|---|---|---|---|
| 5,212,106 A | * | 5/1993 | Erb et al. ................ 438/289 |
| 5,573,965 A | * | 11/1996 | Chen et al. ............. 438/297 |
| 5,918,125 A | * | 6/1999 | Guo et al. .............. 438/264 |
| 6,613,636 B2 | * | 9/2003 | Wada et al. ............ 438/301 |
| 7,244,642 B2 | * | 7/2007 | Vitale et al. ........... 438/197 |
| 7,473,599 B2 | * | 1/2009 | Jeng ..................... 438/257 |
| 2008/0211008 A1 | * | 9/2008 | Park ...................... 257/321 |

* cited by examiner

*Primary Examiner*—Zandra Smith
*Assistant Examiner*—Paul E Patton
(74) *Attorney, Agent, or Firm*—The Law Offices of Andrew D. Fortney; Andrew D. Fortney (57) ABSTRACT

Disclosed are a semiconductor device and a method for manufacturing the same. The method includes forming a gate layer on a semiconductor substrate; forming a first oxide layer on the semiconductor substrate; forming a second oxide layer on the first oxide layer; exposing the first oxide layer by removing the second oxide layer other than on side surfaces of the gate layer by etching using a photoresist as a mask; and forming junctions in source/drain regions by implanting a high concentration of N-type ions and/or a high concentration of P-type ions using the second oxide layer as a sidewall mask.

17 Claims, 7 Drawing Sheets

SEMICONDUCTOR DEVICE AND METHOD FOR MANUFACTURING THE SAME

This application claims the benefit of Korean Patent Application No. 10-2007-0130937, filed on Dec. 14, 2007, which is hereby incorporated by reference as if fully set forth herein.

BACKGROUND OF THE INVENTION

1. Field of the Invention

The present invention relates to a semiconductor device, and more particularly, to a semiconductor device and a method for manufacturing the same.

2. Discussion of the Related Art

A dynamic random access memory (DRAM) generally includes a cell transistor serving as a switch and a cell capacitor serving as a storage element as components. The DRAM is a volatile random access memory device, which memorizes or erases data through random access to word lines (WL) and bit lines (BL), and loses the data when the power is cut off.

On the other hand, a nonvolatile memory such as a flash memory generally includes only a transistor without a separate capacitor in each cell, different from the DRAM. Such nonvolatile memory is also known as a "floating gate" non-volatile memory because it stores electrons in a thin gate or layer of the transistor. Non-volatile random access memory devices such as flash memory continue to store data although the power is cut off.

Flash memory can erase data in the memory cells due to a tunnel effect of electrons through a single operation, such as a flash erase operation. Further, flash memory has low power consumption and makes high-speed programming possible. Thus, flash memories may be mainly used in products in which the memory frequently changes, such as an automatic answering machine or an electronic pocket notebook.

Figure 1:
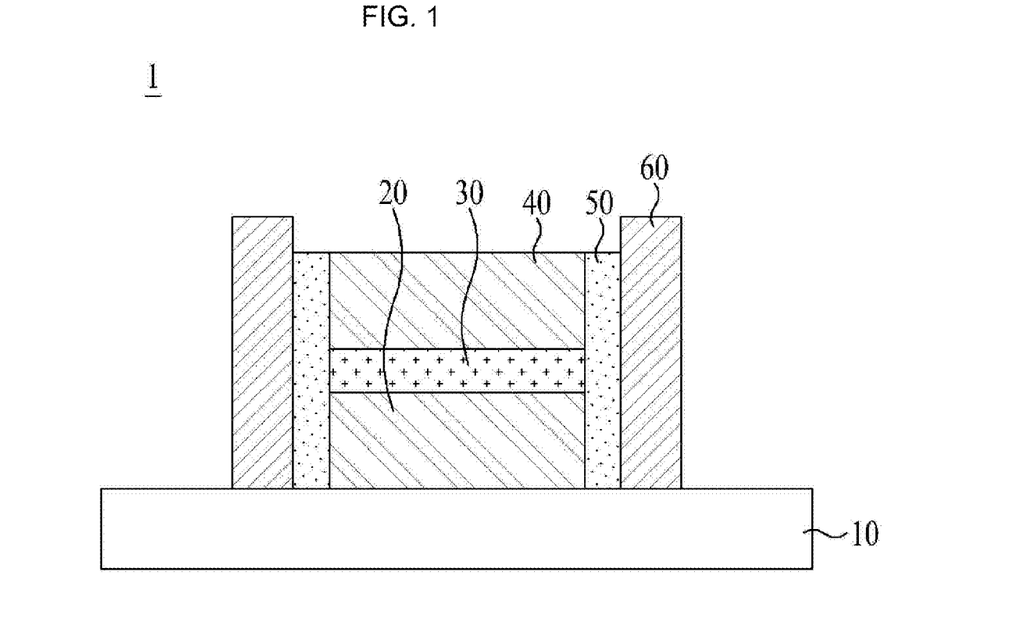
FIG. 1 is a partial cross-sectional view of a conventional flash memory device.

FIG. 1 is a partial cross-sectional view of a conventional flash memory device.

With reference to FIG. 1, a general flash memory device 1 includes floating gates 20 formed on a semiconductor substrate 10 to store electric charges, control gates 40 to erase and program the electric charges stored in the floating gates 20, and a {tunnel} insulating layer 30 made of oxide-nitride-oxide (ONO) layers and formed between the floating gates 20 and the control gates 40. When the floating gates 20 are formed in cell regions, as described above, gates of high voltage transistors may be simultaneously formed in peripheral regions. Also, when the control gates 40 are formed in the cell regions, gates of low voltage transistors may be simultaneously formed in the peripheral regions.

Now, a method for manufacturing the conventional flash memory device 1, as shown in FIG. 1, will be described in brief. A field oxide layer is formed on or in the semiconductor substrate 10 made of a semiconductor material, such as silicon, and then thermal oxidation is performed, thus growing a tunnel oxide layer. Thereafter, a polysilicon layer is deposited, and then etching using photolithography is performed, thus forming the floating gates 20. In FIG. 1, the field oxide layer and the tunnel oxide layer are omitted.

Thereafter, a gate insulating layer 30 is formed by sequentially providing oxide, nitride, and oxide (ONO) layers on the floating gates 20. Next, a polysilicon layer is formed on the gate insulating layer 30, and then patterning and etching using photolithography is performed on the polysilicon-insulator-polysilicon stack, thus forming the control gate 40.

Thereafter, low concentration N-type ions and/or low concentration P-type ions are implanted into source/drain regions at sides of the floating gates 20, and spacers 50 and 60 respectively made of oxide and silicon nitride (SiN) for high concentration ion implantation into the source/drain regions are sequentially formed on the sidewalls of the gates 20 and 40. Thereafter, high concentration N-type ions and/or high concentration P-type ions are implanted using the oxide spacer 50 and the nitride spacer 60 as a mask to form junctions in the source/drain regions.

However, the nitride spacer 60, which prevents ions from being implanted into the region of the substrate 10 under the gates, may cause a physical stress on the floating gates 20. Further, when the nitride spacer 60 is formed, traps or trap sites may be formed on the semiconductor substrate 10, which may lower the reliability of the device due to deterioration during annealing.

SUMMARY OF THE INVENTION

Accordingly, the present invention is directed to a semiconductor device and a method for manufacturing the same.

One object of the present invention is to provide a semiconductor device and a method for manufacturing the semiconductor device, which reduces or prevents the generation of a physical stress applied to floating gates and the formation of traps or trap sites on a semiconductor substrate thereby improving the reliability of the device.

To achieve this object and other advantages and in accordance with the purpose of the invention, as embodied and broadly described herein, a method for manufacturing a semiconductor device includes forming a gate layer on a semiconductor substrate; forming a first oxide layer on the semiconductor substrate; forming a second oxide layer on the semiconductor substrate; exposing the first oxide layer by removing the second oxide layer in regions other than side surfaces of the first oxide layer by etching using a photoresist as a mask; and forming junctions in source/drain regions by implanting a high concentration of N-type ions and/or a high concentration of P-type ions using the second oxide layer as a sidewall mask.

In another aspect of the present invention, a semiconductor device includes a gate layer on a semiconductor; an oxide layer surrounding the upper and side surfaces of the gate layer; and a spacer on side surfaces of the oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to preferred embodiments of the present invention, examples of which are illustrated in the accompanying drawings.

Figure 2A:
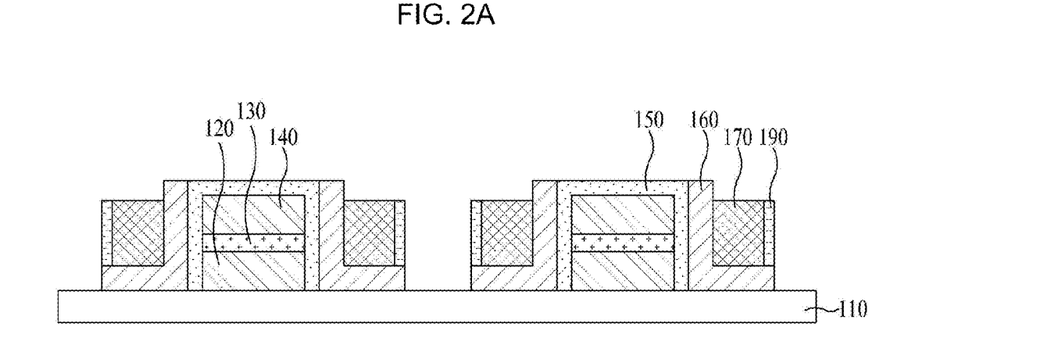
FIGS. 2A-2B are cross-sectional views of exemplary flash memory devices manufactured in accordance with embodiments of the present invention.
Figure 2B:
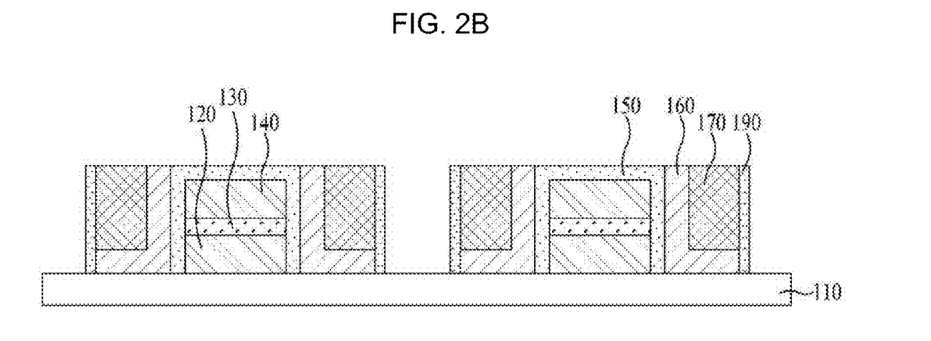

FIGS. 2A-2B are cross-sectional views of exemplary flash memory devices manufactured by a method in accordance with embodiments of the present invention.

With reference to FIG. 2A, a flash memory device 100 manufactured by a method in accordance with an embodiment of the present invention includes floating gates 120 formed on a semiconductor substrate 110 to store electric charges, control gates 140 to erase and program the electric charges stored in the floating gates 120, and a tunnel insulating layer 130 (which, in one embodiment, comprises an oxide-nitride-oxide [ONO] trilayer), formed on the floating gates 120, before the control gates 140.

The flash memory device 100 further includes an oxide layer 150 surrounding the upper surface of the control gates 140 and the side surfaces of the floating and control gates 120 and 140, and a first TEOS layer 160, a second TEOS layer 170, and a nitride layer 190, sequentially formed on the side surface of the oxide layer 150. Alternatively, the first and second layers 160 and 170 may comprise another silicon oxide, e.g., a plasma silane, an undoped silicate glass (USG), a silicon-rich oxide, etc. Also, one of the first and second layers 160 and 170 may comprise a first silicon oxide, and the other of the first and second TEOS layers 160 and 170 may comprise a second silicon oxide different from the first silicon oxide. FIG. 2B shows an embodiment where the first and second layers 160 and 170 have no etch rate difference between them (e.g., they are composed of the same material, such as TEOS).

FIGS. 3A to 3J are cross-sectional views illustrating an exemplary method for manufacturing a semiconductor device in accordance with embodiments of the present invention.

Figure 3A:
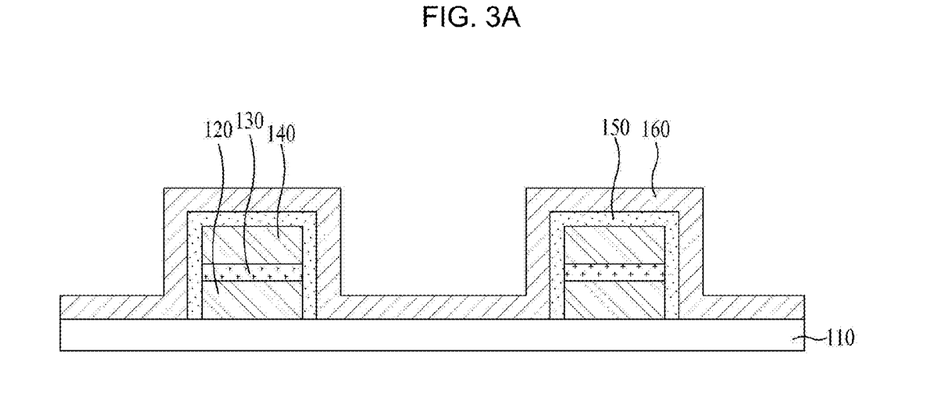
FIGS. 3A to 3J are cross-sectional views illustrating an exemplary method for manufacturing a semiconductor device in accordance with embodiments of the present invention.

First, using a general method for manufacturing a flash memory device, a polysilicon layer for the floating gates 120 is formed on a tunnel dielectric layer (not shown) on the semiconductor substrate 110. Semiconductor substrate 110 may comprise, for example, single-crystal silicon. Thereafter, a gate insulating layer 130 is formed on the floating gates 120 by sequentially forming oxide-nitride-oxide (ONO) layers. Alternatively, the gate insulating layer 130 may comprise an oxide layer alone, or an oxide-nitride bilayer.

Thereafter, a second polysilicon layer is formed on the gate insulating layer 130, and then the entire polysilicon-gate dielectric-polysilicon-tunnel dielectric stack is patterned using photolithography then etched using the photolithographic pattern as a mask, thus forming the control gates 140, gate insulating layer 130 and floating gates 120. The tunnel dielectric layer (not shown) may or may not be etched, depending on the fabrication process. When the tunnel dielectric layer is not etched, it may function as an etch stop layer.

Thereafter, in an embodiment in which the tunnel dielectric may be etched, as shown in FIG. 3A, an oxide is formed (e.g., by deposition) on the entire surface of the semiconductor substrate 110, and then a photoresist (PR) is applied to the upper surface of the oxide and patterned using photolithography. Next, etching is performed using the photoresist remaining in the regions for the gates 120 and 140 as a mask, thus forming the oxide layer 150 (which may have a thickness of 40~60 Å to surround the upper surface of the control gates 140 and the side surfaces of the floating and control gates 120 and 140. In an embodiment in which the tunnel dielectric is not etched, the oxide layer 150 may be formed by thermal oxidation of the floating and control gates 120 and 140.

Thereafter, an oxide derived from tetraethyl orthosilicate (TEOS) is applied to (e.g., deposited on) the surface of the semiconductor substrate 110 (e.g., by chemical vapor deposition), thus forming a first TEOS layer 160 having a thickness of 50~100 Å.

Figure 3B:
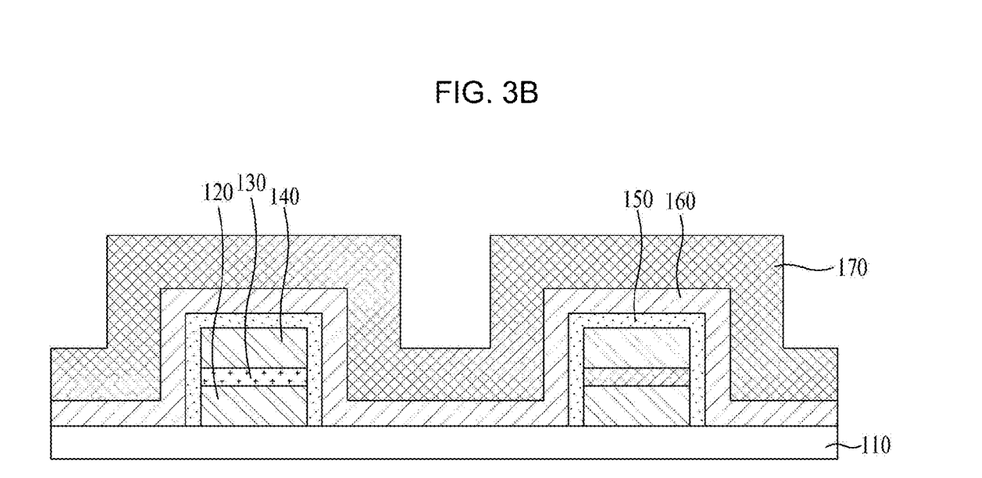

Thereafter, as shown in FIG. 3B, another TEOS-based oxide layer is deposited on the semiconductor substrate 110 (e.g., on the first TEOS layer 160, including the sidewalls thereof) and over the regions for the gates 120 and 140, thus forming a second TEOS layer 170 having a thickness of 770~1,000 Å.

Figure 3C:
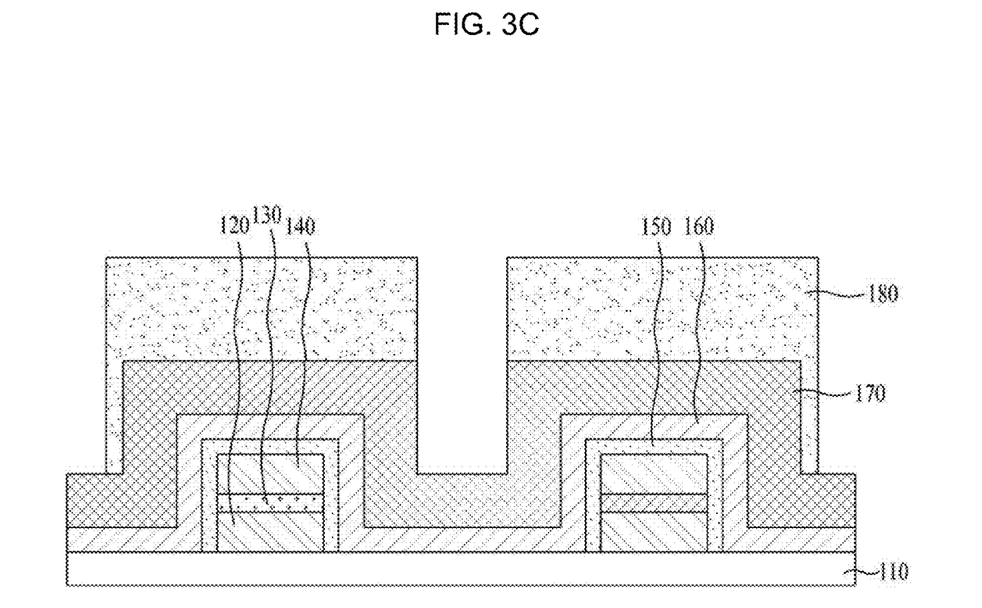

Thereafter, as shown in FIG. 3C, a photoresist 180 is applied to the upper surface of the second TEOS layer 170 and patterned using photolithography, thus removing the photoresist 180 formed in regions corresponding to the upper surfaces of the control gates 140.

Figure 3D:
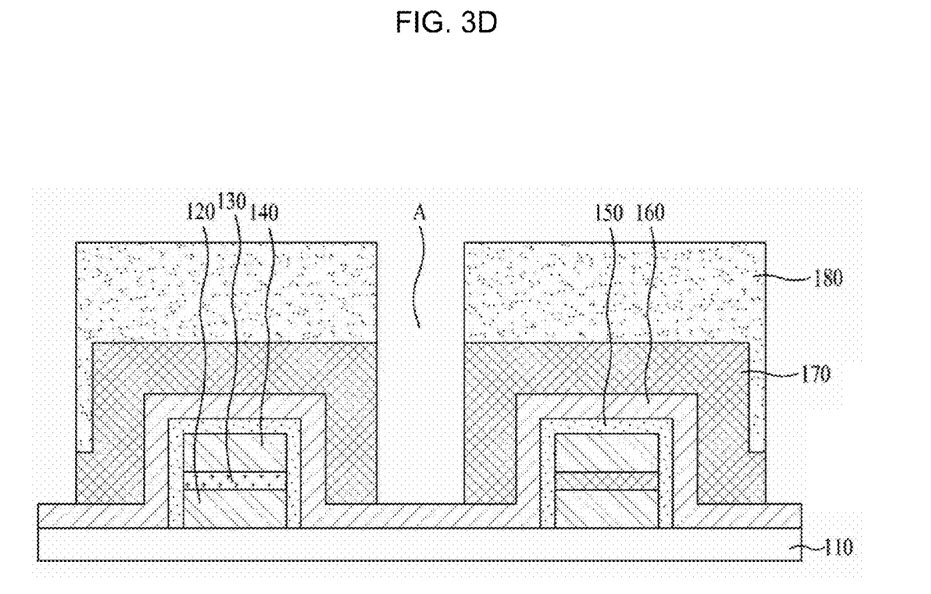

Thereafter, as shown in FIG. 3D, etching using the patterned photoresist 180 as a mask is performed, thus removing the second TEOS layer 170 from over the upper surfaces of the control gates 140. Portions of the second TEOS layer 170 formed on the side surfaces of the first oxide layer 160 and/or the gates 120 and 140, masked by the patterned photoresist 180, remain. The first TEOS layer 160 on the upper surfaces of the control gates 140 is opened or exposed, as shown by opening "A", through the above etching. When the first and second oxide layers 160 and 170 are different, an etch selectivity difference between the first and second oxide layers 160 and 170 (e.g., when the etch rate of the second oxide layer 170 is greater than the etch rate of the first oxide layer 160 under the conditions of etching the second oxide layer 170) may enable the first oxide layer 160 to function as a kind of etch stop layer.

Figure 3E:
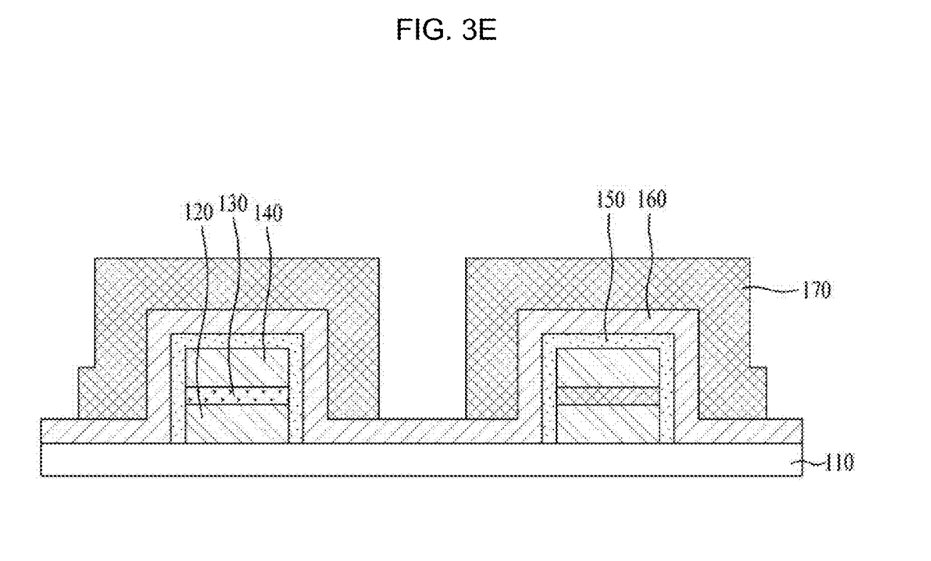

Thereafter, as shown in FIG. 3E, the photoresist 180 remaining on the semiconductor substrate 110 is removed.

Figure 3F:
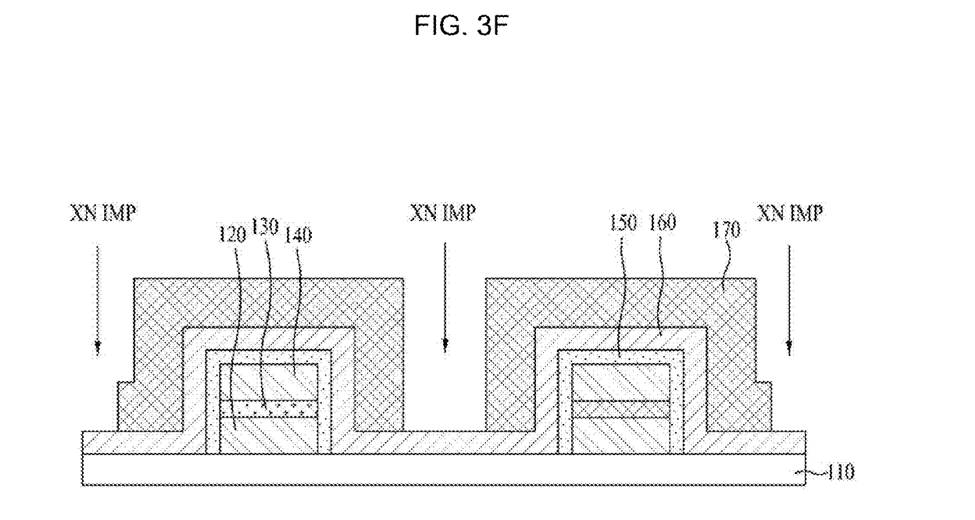
Figure 3G:
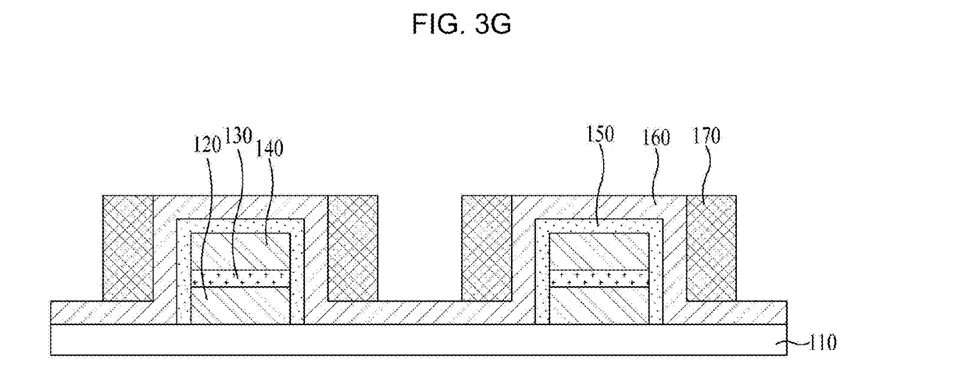

Thereafter, as shown in FIG. 3F, a high concentration of N-type ions and (generally in a separate process) a high concentration of P-type ions are implanted into the semiconductor substrate 110 (XN IMP) to form junctions in source/drain regions using the second TEOS layer formed on the side surfaces of the regions for the gates and 140 as a sidewall mask. After the ion implantations have been completed, as shown in FIG. 3G, the second TEOS layer 170 in other regions except for the side surfaces of the gates 120 and 140 is selectively removed by isotropic etching in the case where there is an etch rate difference between the second oxide (TEOS) layer 170 and the first oxide layer 160. In the case where there is no etch rate difference, the exposed first oxide (TEOS) layer 160 will also be removed, and the substrate 110 exposed.

Figure 3H:
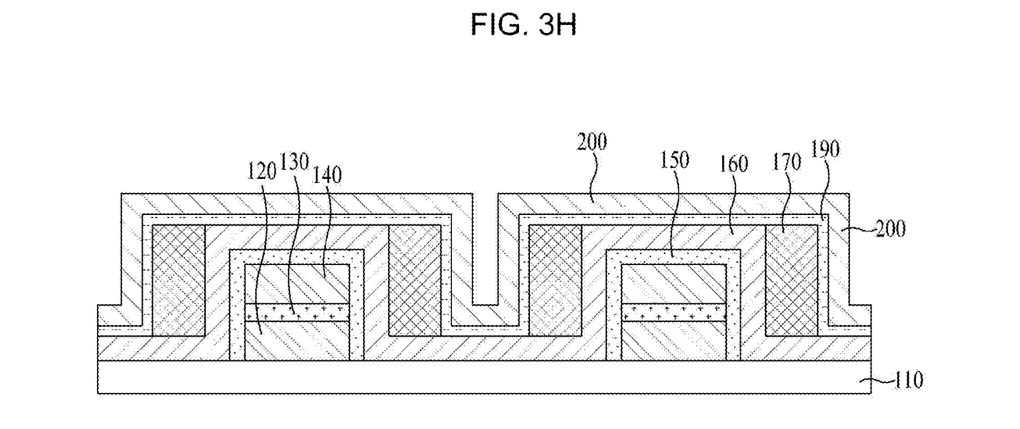

Thereafter, to enable carrying out a salicide process, as shown in FIG. 3H, a nitride layer 190 having a thickness of 50~90 Å (preferably, about 70 Å) is formed by depositing silicon nitride (SiN) on the semiconductor substrate 110, including the gate structures and oxide layer(s). Thereafter, a third TEOS layer 200 having a thickness of 300~500 Å (preferably, 400 Å) is formed by depositing TEOS on the nitride layer 190.

Figure 3I:
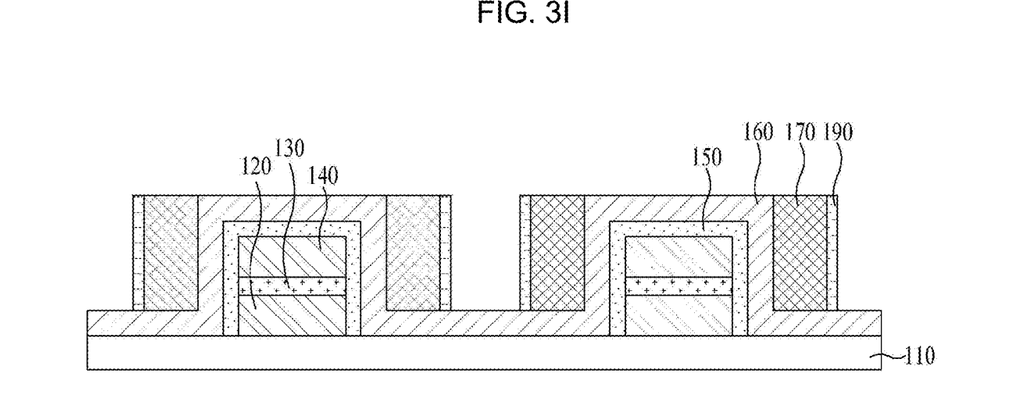

Thereafter, as shown in FIG. 3I, the nitride layer and the third TEOS layer 200 formed on the upper surfaces of the regions for the gates 120 and 140 and formed between the neighboring gate regions are removed by etching the nitride layer 190 and the third TEOS layer 200. The third TEOS layer 200 may be wet etched (e.g., with dilute aqueous HF or a buffered oxide etch [BOE]), or isotropically or anisotropically etched to completely remove the third TEOS layer 200. Alternatively, the third TEOS layer 200 need not be deposited. The nitride layer may be etched isotropically (e.g., by plasma dry etching) to form nitride spacers 190. In the case where there is no etch rate difference between the first and second oxide layers 160 and 170 (e.g., they are composed of the same material, such as TEOS), the structure of FIG. 2B is formed.

Figure 3J:
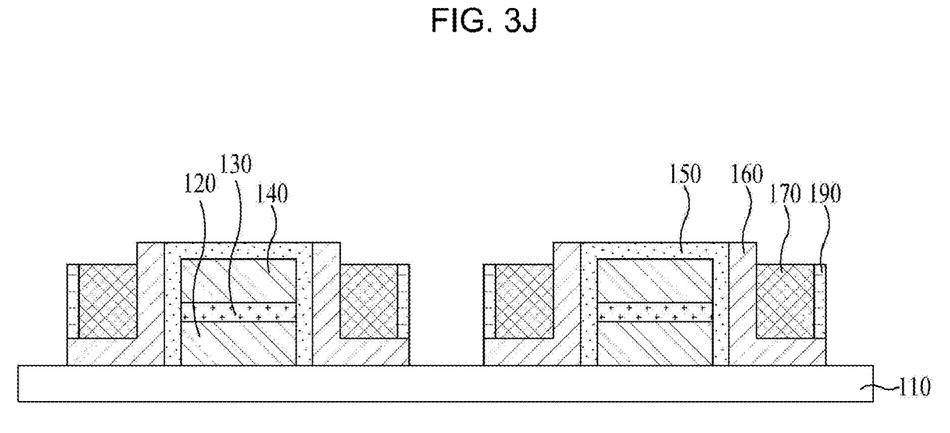

Thereafter, as shown in FIG. 3J, the first TEOS layer 160 on the upper surfaces of the gates 120 and 140 and between the neighboring gate regions is removed by washing (e.g., wet etching with dilute aqueous HF or BOE), prior to a cobalt salicide process. Alternatively, the first oxide layer 160 can be removed simultaneously with the second oxide layer 170 and the nitride layer 190 by non-selective dry (e.g., plasma) etching to form the structures shown in FIGS. 2A and 3J. In a further embodiment, the (non-selective) etching continues, and the oxide layer 150 is removed until the upper surface of the control gate 140 is exposed.

Thereafter, a silicide layer using cobalt (Co) is formed through rapid thermal annealing, which is performed on the upper surfaces of the source/drain junction regions (and optionally on the upper surfaces of the control gates 140) at a designated temperature. Generally, a silicide-forming metal (e.g., cobalt, titanium, tungsten, nickel, molybdenum, platinum, etc.) is blanket-deposited (e.g., by sputtering), the metal and the substrate are heated to a silicide-forming temperature (e.g., 600-1000° C.) sufficiently to form the metal silicide, and the unreacted metal (e.g., on the oxide and/or nitride layer[s]) is removed by selective etching.

In the exemplary methods for manufacturing the semiconductor device in accordance with embodiments of the present invention, a spacer made of silicon nitride (SiN), conventionally used in the implantation of N-type ions and P-type ions at high concentrations to form junctions in source/drain regions, is replaced with a plurality of oxide (e.g., TEOS) layers, and thus it is possible to reduce or prevent the generation and/or effects of physical stress applied to floating gates due to the use of a more proximate silicon nitride (SiN) spacer. The present invention also helps to reduce or prevent the formation of traps or trap sites on the semiconductor substrate to improve the reliability of the device.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for manufacturing a semiconductor device comprising:

forming a plurality of gates on a semiconductor substrate;
   forming a first oxide layer on the semiconductor substrate and the plurality of gates;
   forming a second oxide layer on the first oxide layer;
   exposing the first oxide layer in regions between adjacent gates by removing the second oxide layer in regions other than side surfaces of the first oxide layer by etching using a patterned photoresist as a mask;
   forming junctions in source/drain regions of the substrate by implanting a high concentration of N-type ions and/or a high concentration of P-type ions using the second oxide layer as a sidewall mask; and
   after forming the junctions in the source/drain regions, depositing a nitride layer on the semiconductor substrate, including the plurality of gates and the first and second oxide layers.

2. The method according to claim 1, wherein depositing the nitride layer comprises depositing a silicon nitride (SiN) layer having a thickness of 50~90 Å.

3. The method according to claim 2, further comprising forming a third oxide layer having a thickness of 300~500 Å by depositing tetraethyl orthosilicate (TEOS) on the nitride layer.

4. The method according to claim 2, further comprising removing the nitride layer over the plurality of gates and between adjacent gates by anisotropic etching.

5. The method according to claim 2, further comprising removing the first oxide layer on the plurality of gates and exposed between adjacent gates by washing.

6. The method according to claim 5, further comprising forming a silicide layer on an upper surface of the plurality of gates and the source/drain junction regions.

7. The method according to claim 1, wherein the first oxide layer comprises tetraethyl orthosilicate (TEOS).

8. The method according to claim 7, wherein the first oxide layer has a thickness of 50~100 Å.

9. The method according to claim 1, wherein the second oxide layer comprises tetraethyl orthosilicate (TEOS).

10. The method according to claim 9, wherein the second oxide layer has a thickness of 770~1,000 Å.

11. The method according to claim 1, further comprising depositing a photoresist on the second oxide layer and patterning the photoresist by photolithography to form the patterned photoresist.

12. The method according to claim 1, wherein removing the second oxide layer in regions other than the side surfaces of the first oxide layer comprises anisotropically etching the second oxide layer, before implanting the high concentration of N-type ions and/or the high concentration of P-type ions.

13. The method according to claim 6, wherein forming the silicide layer comprises depositing cobalt on the semiconductor substrate and performing rapid thermal annealing at a designated temperature.

14. The method according to claim 1, wherein each of the plurality of gates comprises a tunnel dielectric layer, a floating gate thereon, a gate dielectric layer on the floating gate, and a control gate on the gate dielectric layer.

15. The method of claim 4, wherein removing the nitride layer forms a nitride spacer at a sufficient distance from each of the plurality of gates to prevent or reduce a physical stress and/or effects of said physical stress on the gates, and prevent or reduce formation of trap sites on the semiconductor substrate.

16. The method of claim 1, wherein the first oxide layer is formed directly on the plurality of gates and the semiconductor substrate, and the second oxide layer is formed directly on the first oxide layer.

17. The method of claim 2, wherein the first oxide layer is formed directly on the plurality of gates and the semiconductor substrate, and the second oxide layer is formed directly on the first oxide layer.

* * * * *